United States Patent
Han

(10) Patent No.: US 10,770,622 B2
(45) Date of Patent: Sep. 8, 2020

(54) LIGHT-EMITTING ELEMENT AND LIGHT-EMITTING ELEMENT PACKAGE COMPRISING SAME

(71) Applicant: LG INNOTEK CO., LTD., Seoul (KR)

(72) Inventor: Young Hun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/066,975

(22) PCT Filed: Dec. 15, 2016

(86) PCT No.: PCT/KR2016/014693
§ 371 (c)(1),
(2) Date: Jun. 28, 2018

(87) PCT Pub. No.: WO2017/116048
PCT Pub. Date: Jul. 6, 2017

(65) Prior Publication Data
US 2019/0013437 A1    Jan. 10, 2019

(30) Foreign Application Priority Data
Dec. 29, 2015 (KR) .................. 10-2015-0188180

(51) Int. Cl.
*H01L 33/24* (2010.01)
*H01L 33/06* (2010.01)
(Continued)

(52) U.S. Cl.
CPC .......... *H01L 33/24* (2013.01); *H01L 33/0025* (2013.01); *H01L 33/025* (2013.01);
(Continued)

(58) Field of Classification Search
CPC ..... H01L 33/025; H01L 33/14; H01L 33/145; H01L 33/20; H01L 33/22; H01L 33/24
See application file for complete search history.

(56) References Cited

U.S. PATENT DOCUMENTS

2006/0246612 A1* 11/2006 Emerson ................. H01L 33/24
                                                                  438/22
2010/0155704 A1    6/2010 Oh et al.
(Continued)

FOREIGN PATENT DOCUMENTS

JP        2006-108487 A    4/2006
KR    10-2010-0073702 A    7/2010
(Continued)

*Primary Examiner* — Ermias T Woldegeorgis
(74) *Attorney, Agent, or Firm* — Birch, Stewart, Kolasch & Birch, LLP

(57) ABSTRACT

One embodiment of a light-emitting element comprises: a substrate; a first-conductive type semiconductor layer disposed on the substrate and including at least one pit; a superlattice layer disposed on the first-conductive type semiconductor layer and including at least one pit; an active layer disposed on the superlattice layer and including at least one pit; an electron blocking layer disposed on the active layer and including at least one pit; a pit layer disposed on the electron blocking layer and including at least one pit; and a second-conductive type semiconductor layer disposed on the pit layer, wherein the pit layer can be doped with Mg at at least a portion thereof.

20 Claims, 2 Drawing Sheets

(51) Int. Cl.
 *H01L 33/00* (2010.01)
 *H01L 33/32* (2010.01)
 *H01L 33/62* (2010.01)
 *H01L 33/14* (2010.01)
 *H01L 33/02* (2010.01)

(52) U.S. Cl.
 CPC ............ *H01L 33/06* (2013.01); *H01L 33/145* (2013.01); *H01L 33/32* (2013.01); *H01L 33/325* (2013.01); *H01L 33/62* (2013.01); *H01L 33/0095* (2013.01)

(56) References Cited

U.S. PATENT DOCUMENTS

| | | |
|---|---|---|
| 2015/0115223 A1 | 4/2015 | Kwak et al. |
| 2016/0141455 A1* | 5/2016 | Lim ................. H01L 33/24 257/13 |

FOREIGN PATENT DOCUMENTS

| KR | 10-2012-0134339 A | 12/2012 |
|---|---|---|
| KR | 20120134339 A * | 12/2012 |
| KR | 10-2015-0112274 A | 10/2015 |
| KR | 10-2015-0120268 A | 10/2015 |
| KR | 20150120268 A * | 10/2015 |

* cited by examiner

LIGHT-EMITTING ELEMENT AND LIGHT-EMITTING ELEMENT PACKAGE COMPRISING SAME

Cross Reference to Related Applications

This application is the National Phase of PCT International Application No. PCT/KR2016/014693, filed on Dec. 15, 2016, which claims priority under 35 U.S.C. 119(a) to Patent Application No. 10-2015-0188180, filed in the Republic of Korea on Dec. 29, 2015, all of which are hereby expressly incorporated by reference into the present application.

TECHNICAL FIELD

Embodiments relate to a light-emitting element and a light-emitting element package including the same.

BACKGROUND ART

The information disclosed in this Background section does not form the prior art and is only for enhancement of understanding of the background of embodiments.

Group 3 to 5 compound semiconductors such as GaN or AlGaN have been widely used for optoelectronics and electronic devices due to many advantages thereof such as wide and easily adjustable band gap energy.

In particular, a light-emitting element such as a light emitting diode or a laser diode using groups 3 to 5 or 2 to 6 compound semiconductor materials of a semiconductor is capable of realizing various colors such as red, green, blue, and ultraviolet by virtue of thin film growth technologies and device materials, is also capable of realizing white light with high efficiency using a fluorescent material or via color combination, and advantageously has low power consumption, semi-permanent lifetime, rapid response speed, safety, and environmental friendliness compared with an existing light source such as a fluorescent lamp or an incandescent lamp.

Accordingly, the light-emitting element has been expansively applied to a transmission module of an optical communication device, a light-emitting diode backlight replacing a cold cathode fluorescent lamp (CCFL) included in a backlight of a liquid crystal display (LCD) display device, a light-emitting diode illumination device replacing a fluorescent lamp or an incandescent lamp, a vehicle headlight, and a traffic light.

With regard to such a light-emitting element, when current is applied thereto, electrostatic discharge (ESD) may occur and, when an amount of ESD is excessive, a defective light-emitting device may be produced and luminous efficiency and optical power of a light-emitting element may be degraded.

DISCLOSURE

Technical Problem

Embodiments provide a light-emitting element for effectively blocking or reducing electrostatic discharge (ESD) or enhancing luminous efficiency and optical power of the light-emitting element.

It is to be understood that both the foregoing general description and the following detailed description of the embodiments are exemplary and explanatory and are intended to provide further explanation of the embodiments as claimed.

Technical Solution

In one embodiment, a light-emitting element includes a substrate, a first-conductive semiconductor layer disposed on the substrate and including at least one pit, a superlattice layer disposed on the first-conductive semiconductor layer and including at least one pit, an active layer disposed on the superlattice layer and including at least one pit, an electron blocking layer disposed on the active layer and including at least one pit, a pit layer disposed on the electron blocking layer and including at least one pit, and a second conductive-type semiconductor layer disposed on the pit layer, wherein at least a portion of the pit layer is doped with magnesium (Mg).

In another embodiment, a light-emitting element includes a substrate, a first conductive-type semiconductor layer disposed on the substrate and including at least one pit, a superlattice layer disposed on the first-conductive semiconductor layer and including at least one pit, an active layer disposed on the superlattice layer and including at least one pit, an electron blocking layer disposed on the active layer and including at least one pit, a pit layer disposed on the electron blocking layer and including at least one pit, and a second conductive-type semiconductor layer disposed on the pit layer, wherein the pit layer includes a first layer including MgN and a second layer including GaN, and wherein the first layer and the second layer of the pit layer are provided in a plural number and the plurality of first layers and the plurality of second layers are alternately stacked.

In another embodiment, a light-emitting element package includes a body including a cavity, a lead frame installed on the body, and the light-emitting element electrically connected to the lead frame.

Advantageous Effects

A light-emitting element according to embodiments may be configured in such a way that a pit layer doped with Mg is formed to effectively block or reduce electrostatic discharge (ESD) and, simultaneously, to enhance luminous efficiency and optical power of the light-emitting element.

In the embodiments, after a first layer and a second layer are stacked, an annealing process is performed to form a GaN structure with satisfactory quality, thereby enhancing hole injection efficiency to an active layer.

BEST MODE

Figure 1:
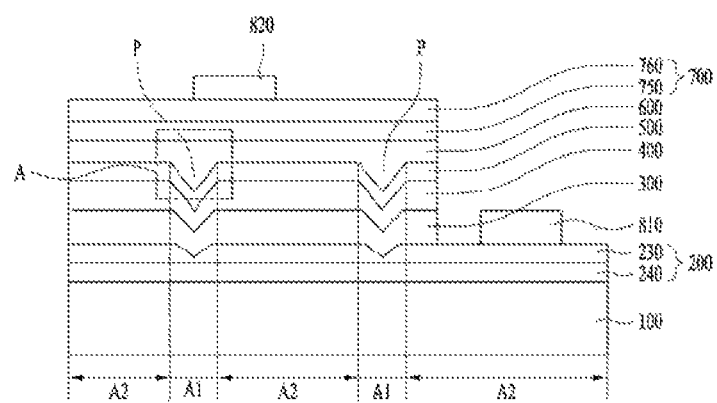
FIG. 1 is a cross-sectional view of a light-emitting element according to an embodiment.

Hereinafter, embodiments will be described in detail with reference to the attached drawings. The embodiments may, however, be embodied in many alternate forms and the disclosure should not be construed as limited to the embodiments set forth herein. Accordingly, while the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the embodiments as defined by the claims. Throughout this specification, sizes, shapes, or the like of components shown in the drawings may be exaggerated for clarity and convenience of description.

The terms such as "first" and "second" are used herein merely to describe a variety of constituent elements, but the constituent elements are not limited by the terms. The terms are used only for the purpose of distinguishing one constituent element from another constituent element. In addition, terms defined in consideration of configuration and operation of embodiments are used only for illustrative purposes and are not intended to limit the scope of the embodiments.

In description of exemplary embodiments, it will be understood that, when an element is referred to as being "on" or "under" another element, the element can be directly on another element or intervening elements may be present. In addition, when an element is referred to as being "on" or "under" another element, this may include the meaning of an upward direction or a downward direction based on one component.

In addition, in the description of the various embodiments, although relative terms such as, for example, "first", "second", "on/upper/above" and "beneath/lower/below may be used to distinguish any one substance or element with another substance or element without requiring or containing any physical or logical relationship or sequence between these substances or elements.

FIG. 1 is a cross-sectional view of a light-emitting element according to an embodiment. As shown in FIG. 1, the light-emitting element according to the embodiment may include a substrate 100, a first conductive-type semiconductor layer 200, a superlattice layer 300, an active layer 400, an electron blocking layer 500, a pit layer 600, the second conductive-type semiconductor layer 700, a first electrode 810, and a second electrode 820.

In this case, the first conductive-type semiconductor layer 200, the superlattice layer 300, the active layer 400, the electron blocking layer 500, the pit layer 600, and a second conductive-type semiconductor layer 700 may form a light-emitting structure.

The substrate 100 may support the light-emitting structure. The substrate 100 may be formed of any one of sapphire, silicon (Si), zinc oxide (Zno), and nitride semiconductors or may be formed as a template formed by stacking at least any one of GaN, InGaN, AlGaN, and AlInGaN.

The light-emitting structure may be disposed on the substrate 100 and may generate light. In this case, stress may be generated in a boundary surface portion between the substrate 100 and the light-emitting structure due to a difference in lattice constant, thermal expansion coefficient, or the like between the substrate 100 and the light-emitting structure.

To alleviate such stress generation, a buffer layer (not shown) may be interposed between the substrate 100 and the light-emitting structure. To enhance the crystalline property of the first conductive-type semiconductor layer 200, an undoped semiconductor layer (not shown) may be interposed therebetween. However, a small amount of unintended impurities may be doped during a manufacturing process.

In this case, the buffer layer may be grown at low temperature and may be formed of a material such as GaN or AlN but the embodiment is not limited thereto and, in this case, the undoped semiconductor layer may be the same as the first conductive-type semiconductor layer 200 except that the undoped semiconductor layer is not doped with an n-type dopant to have lower electrical conductivity than the first conductive-type semiconductor layer 200.

As shown in FIG. 1, the first electrode 810 may be disposed on a step difference portion, through which the first conductive-type semiconductor layer 200 is exposed, and the second electrode 820 may be disposed on a portion through which an upper portion of the second conductive-type semiconductor layer 700 is exposed. When current is applied through the first electrode 810 and the second electrode 820, the light-emitting element according to the embodiment may emit light.

Although FIG. 1 illustrates a horizontal-type light-emitting element, a structure of a vertical-type light-emitting element or a flip-chip light-emitting element may also be employed.

As described above, the light-emitting structure may include the first conductive-type semiconductor layer 200, the superlattice layer 300, the active layer 400, the electron blocking layer 500, the pit layer 600, and the second conductive-type semiconductor layer 700.

The first conductive-type semiconductor layer 200 may be disposed on the substrate 100 and may include at least one pit P. The first conductive-type semiconductor layer 200 may be formed of, for example, a nitride semiconductor.

That is, the first conductive-type semiconductor layer 200 may be selected from semiconductor materials represented by compositional formula $In_xAl_yGa_{1-x-y}N$ ($0 \le x \le 1$, $0 \le y \le 1$, $0 \le x+y \le 1$), e.g., GaN, AlN, AlGaN, InGaN, InN, InAlGaN and AlInN, and may be doped with an n-type dopant such as Si, Ge, Sn, Se, and Te.

The first conductive-type semiconductor layer 200 may include a third layer 230 and a fourth layer 240. The third layer 230 may include the pit P formed thereon and may be arranged below the superlattice layer 300. The fourth layer 240 may be arranged below the third layer 230 and may be arranged on the substrate 100.

In this case, the fourth layer 240 may be doped with the n-type dopant with a higher doping concentration than the third layer 230. As a doping concentration of an n-type dopant is increased, a higher number of electrons as a carrier may be generated. In addition, it may be required to smoothly move electrons in a direction toward the second conductive-type semiconductor layer 700 from the first conductive-type semiconductor layer 200.

For this reason, the first conductive-type semiconductor layer 200 may be formed by sequentially forming the fourth layer 240 and the third layer 230 in a direction toward the second conductive-type semiconductor layer 700 and, in this case, the fourth layer 240 may be doped with an n-type dopant with a higher doping concentration than the third layer 230.

Accordingly, the fourth layer 240 with a high number of electrons and the third layer 230 with a relatively small number of electrons may be arranged to face each other and, thus, electrons may be moved in a direction toward the third layer 230 from the fourth layer 240 based on an electron concentration difference.

Due to this structure, electrons may be smoothly moved in a direction toward the second conductive-type semiconductor layer 700 from the first conductive-type semiconductor layer 200.

The superlattice layer 300 may be arranged on the first conductive-type semiconductor layer 200 and may include at least one pit P.

For example, the superlattice layer 300 may be configured by stacking a plurality of pairs of unit superlattice layers 300 and the pair of unit superlattice layers 300 may be formed of, for example, InGaN/GaN, InGaN/InGaN, or the like.

The superlattice layer 300 may be arranged between the first conductive-type semiconductor layer 200 and the active layer 400 and may function as a buffer layer.

That is, when the first conductive-type semiconductor layer 200 and the active layer 400 are directly coupled to each other, stress may be generated at a boundary surface portion between the first conductive-type semiconductor layer 200 and the active layer 400 due to a difference in lattice constant, thermal expansion coefficient, or the like between the first conductive-type semiconductor layer 200 and the active layer 400. The superlattice layer 300 may alleviate such stress generation.

Since the superlattice layer 300 has high electric resistance compared with other portions, the light-emitting element according to the embodiment may be protected from electrostatic discharge (ESD) and current applied to the light-emitting element according to the embodiment may be distributed to enhance luminous efficiency and optical power thereof.

The active layer 400 may be disposed on the superlattice layer 300 and may include at least one pit P. The active layer 400 may generate light from energy generated during recombination of electrons and holes which are provided from the first conductive-type semiconductor layer 200 and the second conductive-type semiconductor layer 700.

The active layer 400 may be formed of a semiconductor compound, for example, a compound semiconductor of group III to V and II to VI, and may be formed as a single well structure, a multi-well structure, a single quantum well structure, a multi-quantum well (MQW) structure, a quantum-wire structure, a quantum dot structure, or the like.

When the active layer 400 is a quantum well structure, the active layer 400 may have a single or multi-quantum well structure including a quantum well layer represented by compositional formula, for example, $In_xAl_yGa_{1-x-y}N$ ($0 \leq x \leq 1$, $0 \leq y \leq 1$, $0 \leq x+y \leq 1$), and a barrier layer represented by compositional formula, for example, $In_aAl_bGa_{1-a-b}N$ ($0 \leq a \leq 1$, $0 \leq b \leq 1$, $0 \leq a+b \leq 1$).

In this case, the quantum well layer may be configured with a lower energy band gap than an energy band gap of the barrier layer.

The electron blocking layer 500 may be disposed on the active layer 400 and may include at least one pit P. Electrons may be moved at higher moving speed than holes. Accordingly, the electron blocking layer 500 may prevent an excessive number of electrons from being moved and collected at a portion adjacent to the second conductive-type semiconductor 700 and may prevent the light-emitting element according to the present embodiment from emitting light at the portion adjacent to the second conductive-type semiconductor layer 700, but not the active layer 400.

Accordingly, the electron blocking layer 500 may block electrons and may protect the active layer 400 to enhance luminous efficiency.

The electron blocking layer 500 may be formed of an $Al_xIn_yGa_{1-x-y}N$ ($0 \leq x \leq 1$, $0 \leq y \leq 1$)-based semiconductor, may have a higher energy band gap than an energy band gap of the active layer 400, and may be formed to a thickness of, for example, about 100 Å to 600 Å but embodiments are not limited thereto.

According to another embodiment, the electron blocking layer 500 may be formed of $Al_zGa_{(1-z)}N/GaN$ ($0 \leq z \leq 1$). According to another embodiment, the electron blocking layer 500 may be formed to configure an InAlN/GaN layer.

The pit layer 600 may be disposed on the electron blocking layer 500 and may include at least one pit P. Although FIG. 1 illustrates the case in which two pits P are formed on the pit layer 600, the embodiment is not limited thereto and the pit P may be formed in various numbers.

A portion of the pit P of the pit layer 600 has relatively high electric resistance and, thus, the light-emitting element according to the embodiment may be protected from electrostatic discharge (ESD) and current applied to the light-emitting element according to the embodiment may be distributed to enhance luminous efficiency and optical power.

The pit P formed in the first conductive-type semiconductor layer 200, the superlattice layer 300, the active layer 400, and the electron blocking layer 500 may also prevent electrostatic discharge (ESD) of the light-emitting element according to the embodiment and may enhance luminous efficiency and optical power thereof like the pit P of the pit layer 600.

The pit layer 600 may include magnesium (Mg) in at least a portion thereof, may include Mg to effectively prevent ESD, and may further enhance luminous efficiency and optical power. A detailed structure and function of the pit layer 600 is described below in detail with reference to FIGS. 2 to 4.

The second conductive-type semiconductor layer 700 may be disposed on the pit layer 600. In this case, the second conductive-type semiconductor layer 700 may be formed of, for example, a nitride semiconductor.

That is, the second conductive-type semiconductor layer 700 may be selected from semiconductor materials represented by composition formula $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN and may be doped with a p-type dopant such as Mg, Zn, Ca, Sr, and Ba.

The second conductive-type semiconductor layer 700 may include a fifth layer 750 and a sixth layer 760. The fifth layer 750 may be disposed on the pit layer 600 and the sixth layer 760 may be disposed on the fifth layer 750.

In this case, the sixth layer 760 may be doped with the p-type dopant with a higher doping concentration than the fifth layer 750. As a doping concentration of a p-type dopant is increased, a higher number of holes as carriers may be generated. In addition, it may be required to smoothly move holes in a direction toward the first conductive-type semiconductor layer 200 from the second conductive-type semiconductor layer 700.

For this reason, the second conductive-type semiconductor layer 700 may be formed by sequentially forming the sixth layer 760 and the fifth layer 750 in a direction toward the first conductive-type semiconductor layer 200 and, in this case, the sixth layer 760 may be doped with a p-type dopant with a higher doping concentration than the fifth layer 750.

Accordingly, the sixth layer 760 with a high number of holes and the fifth layer 750 with a relatively small number of holes may be arranged to face each other and, thus, holes may be moved in a direction toward the fifth layer 750 from the sixth layer 760 based on a hole concentration difference.

Due to this structure, holes may be easily moved in a direction toward the first conductive-type semiconductor layer 200 from the second conductive-type semiconductor layer 700.

Figure 2:
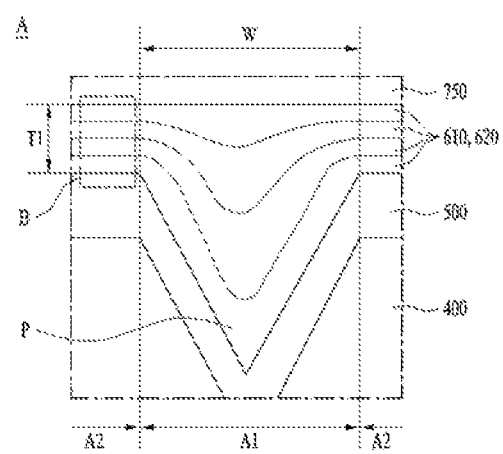
FIG. 2 is an enlarged view showing a portion A shown in FIG. 1.
Figure 3:
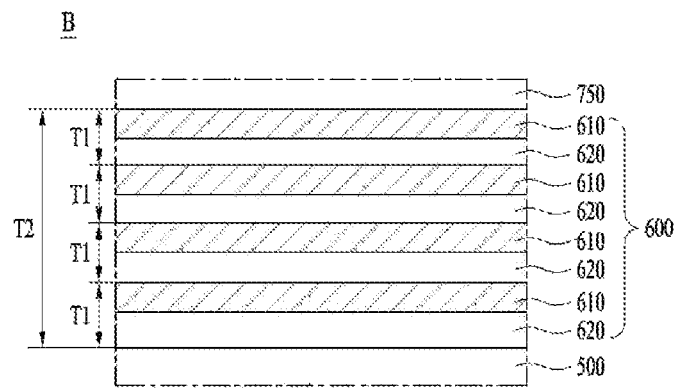
FIG. 3 is an enlarged view showing a portion B shown in FIG. 2 according to an embodiment.

FIG. 2 is an enlarged view showing a portion A shown in FIG. 1. FIG. 3 is an enlarged view showing a portion B shown in FIG. 2 according to an embodiment. The pit P in the pit layer 600 may have a maximum width W of, for example, 180 nm to 250 nm. However, embodiments are not limited thereto.

The pit layer 600 may be doped with Mg. Mg doped in the pit layer 600 may act as a resistor and, thus, the pit layer 600 may be formed as a high resistance layer to protect the light-emitting element according to an embodiment from ESD and to distribute current applied to the light-emitting element according to the embodiment, thereby enhancing luminous efficiency and optical power thereof.

However, Mg has property of absorbing light and, thus, when the pit layer 600 is excessively doped with Mg, the luminous efficiency and optical power of the light-emitting element may be degraded. Accordingly, there is a need for a structure for effectively preventing or reducing ESD and, simultaneously, enhancing the luminous efficiency and optical power of the light-emitting element. Hereinafter, the structure is described in detail.

As shown in FIGS. 2 and 3, the pit layer 600 may include a first layer 610 doped with Mg and a second layer 620 that is the remaining region. For example, the first layer 610 may include MgN and the second layer 620 may include GaN.

The pit layer 600 may include the plurality of first layers 610 and the plurality of second layers 620 and may be configured by alternately stacking the first layers 610 and the second layers 620. That is, as shown in FIG. 3, the pit layer 600 may be formed by stacking a plurality of pairs configured by stacking the first layer 610 and the second layer 620.

Referring to FIG. 3, the pit layer 600 may be configured in such a way that, for example, the second layer 620 including GaN is stacked on an upper surface of the electron blocking layer 500 to configure a lowermost layer and the first layer 610 including MgN may be stacked on an upper surface of the second layer 620. The second layer 620 may be formed of, for example, undoped GaN. However, a small amount of unintended impurities may be doped during a manufacturing process.

An operation of stacking the second layer 620 on the first layer 610 may be repeatedly performed to form the pit layer 600 configured as illustrated in FIG. 3. The pit layer 600 may include, for example, four first layers 610 and four second layers 620 and, accordingly, may include total four pairs of the first layers 610 and the second layers 620. However, embodiments are not limited thereto and three or less or five or more of pairs may be included.

Referring to FIG. 2, the pit layer 600 may include a first region A1 including the pit P formed therein and a second region A2 that is the remaining region. To fill the pit P in the first region A1, the thicknesses of the first layer 610, the second layer 620, and the pair thereof, which are stacked in up and down directions, may each be significantly non-uniform.

However, in the second region A2, the thicknesses of the first layer 610, the second layer 620, and the pair thereof, which are stacked in up and down directions, may each be relatively uniform. In this case, a first thickness T1 measured as a thickness of the second region A2 may be, for example, 30 nm to 50 nm, in more detail, about 40 nm.

In this case, as shown in FIG. 3, when the number of each of the first layers 610, the second layers 620, and the pairs thereof is four, a second thickness T2 measured as the sum of the thicknesses of the first layer 610 and the second layer 620 in the second region A2 may be 5 nm to 15 nm, in more detail, about 10 nm.

The first layer 610 may be doped with Mg with doping concentration of $1 \times 10^{18}$ to $5 \times 10^{18}$ atoms per $cm^3$.

Tables 1 and 2 below show an experimental result of the light-emitting element configured as illustrated in FIGS. 2 and 3. In the experiment, the first thickness T1 may be about 40 nm, the second thickness T2 may be about 10 nm, and the number of each of the first layers 610, the second layers 620, and the pairs thereof may be four.

In the experiment, the first layer 610 may be doped with Mg with doping concentration of $1 \times 10^{18}$ to $5 \times 10^{18}$ atoms per $cm^3$ and, in this range, experimental result values are obtained by averaging result values of repeated experiments while varying doping concentration of Mg.

Table 1 below shows an experimental result of a lateral chip when rated current of 65 mA is applied to a light-emitting element and Table 2 below shows an experimental result of a flip chip when rated current of 350 mA is applied to a light-emitting element.

Sample 1 uses a light-emitting element in which the pit layer 600 is not doped with Mg and includes only GaN and Sample 2 uses the light-emitting element of the present embodiment. Except for this, structures, standards, and experimental conditions of Samples 1 and 2 are the same or almost similar.

TABLE 1

|  | ESD yield (%) | Optical power (mW) |
| --- | --- | --- |
| Sample 1 | 88 | 98.2 |
| Sample 2 | 93.2 | 98.4 |

In Table 1 above, ESD yield refers to a ratio of a lateral chip with a satisfactory electrostatic discharge amount after an electrostatic discharge (ESD) test is performed. A reference for determining whether an electrostatic discharge amount is satisfactory or poor may be a predetermined electrostatic discharge amount that is varied depending on an experimental environment, a chip structure, or the like, but experimental environments of Samples 1 and 2 are the same or almost similar and chip structures of Samples 1 and 2 are the same except for the pit layer 600 of the light-emitting element.

As seen from the experimental result, an ESD yield of Sample 2, that is, a chip using the light-emitting element according to the embodiment is much higher than that of Sample 1, which means that the light-emitting element according to the embodiment has a much lower number of defective products due to ESD than that of Sample 1.

TABLE 2

|  | ESD Percent Defective (%) | Optical power (mW) |
| --- | --- | --- |
| Sample 1 | 9 | 280.7 |
| Sample 2 | 2 | 291.7 |

In Table 2 above, an ESD percent defective refers to a ratio of a defective flip chip due to an excessive electrostatic discharge after an ESD test is performed. A reference for determining whether an electrostatic discharge amount is excessive may be a predetermined electrostatic discharge amount that is varied depending on experimental environment, chip structure, or the like, but experimental environments of Samples 1 and 2 are the same or almost similar and chip structures of Samples 1 and 2 are the same except for the pit layer 600 of the light-emitting element.

As seen from the experimental result, an ESD percentage defective of Sample 2, that is, a chip using the light-emitting element according to the embodiment is much lower than that of Sample 1, which means that the light-emitting element according to the embodiment has a much lower number of defective products due to ESD than that of Sample 1.

As seen from the experimental result, optical power of Sample 2 is much higher than that of Sample 1, which means that the light-emitting element according to the embodiment has enhanced luminous efficiency and optical power compared with Sample 1.

In consideration of the experimental result, the pit layer 600 doped with Mg is formed in the light-emitting element according to the embodiment and, thus, ESD may be effectively blocked or reduced and, simultaneously, luminous efficiency and optical power of the light-emitting element may be enhanced.

Figure 4:
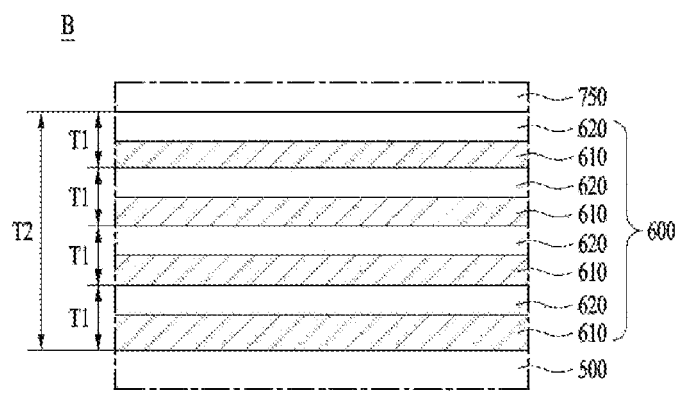
FIG. 4 is an enlarged view of a portion B of FIG. 2 according to another embodiment.

FIG. 4 is an enlarged view of a portion B of FIG. 2 according to another embodiment. In the embodiment illustrated in FIG. 4, a stack order of the first layer 610 and the second layer 620 may be reversed compared with the embodiment illustrated in FIG. 3.

That is, referring to FIG. 4, the pit layer 600 may be configured in such a way that, for example, the first layer 610 including MgN is stacked on an upper surface of the electron blocking layer 500 to configure a lowei most layer and the second layer 620 including GaN may be stacked on an upper surface of the first layer 610.

An operation of stacking the first layer 610 on the second layer 620 may be repeatedly performed to form the pit layer 600 configured as illustrated in FIG. 4. The pit layer 600 may include, for example, four first layers 610 and four second layers 620 and, accordingly, may include total four pairs of the first layers 610 and the second layers 620. However, needless to say, embodiments are not limited thereto.

In addition to the first thickness T1 and the second thickness T2, other structures and standards are the same or almost similar to the light-emitting element according to the embodiment shown in FIG. 3.

According to another embodiment, the first layer 610 and the second layer 620 may not be separately formed on the pit layer 600 and Mg may be entirely doped in the pit layer 600. When the pit layer 600 has this structure, it is noted that doping concentration of Mg is uniform over an entire area of the pit layer 600.

The pit layer 600 may be formed using a method such as chemical vapor deposition and plasma vacuum deposition and, in this regard, after the first layer 610 and the second layer 620 are stacked, an annealing process may be performed.

That is, after one pair formed by stacking the first layer 610 and the second layer 620 is completely formed, an annealing process may be performed and, in this regard, the annealing process may be performed whenever each of the pairs is completely formed.

As annealing proceeds, stress generated in a boundary surface portion between the first layer 610 and the second layer 620 and/or stress separately generated in the first layer 610 and/or the second layer 620 due to a difference in lattice constant, thermal expansion coefficient, or the like may be removed and alleviated to form the pit layer 600 with satisfactory quality.

In particular, GaN included in the first layer 610 may be important in moving holes to the active layer 400 and, when GaN is used in a structure with alleviated stress and satisfactory quality, hole injection efficiency to the active layer 400 may be enhanced.

Accordingly, according to the embodiment, after the first layer 610 and the second layer 620 are stacked, annealing may be performed to form a GaN structure with satisfactory quality, thereby enhancing hole injection efficiency to the active layer 400.

Figure 5:
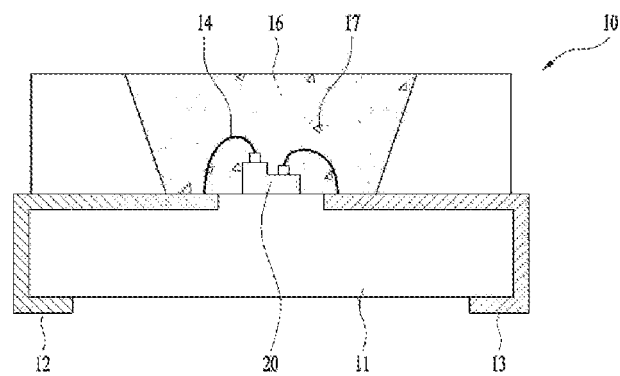
FIG. 5 is a diagram of a light-emitting element package according to an embodiment.

FIG. 5 is a diagram of a light-emitting element package 10 according to an embodiment.

The light-emitting element package 10 according to the embodiment may include a body 11 with a cavity formed therein, a first lead frame 12 and a second lead frame 13 installed on the body 11, a light-emitting element 20 according to the aforementioned embodiment, which is installed on the body 11 and is electrically connected to the first lead frame 12 and the second lead frame 13, and a molding portion 16 formed in the cavity.

The body 11 may be formed of a material including a silicon material, a synthetic resin material, or a metallic material. When the body 11 is formed of a conductive material such as a metallic material, although not illustrated, an insulating layer is formed on a surface of the body 11 via coating to prevent short circuit between the first and second lead frames 12 and 13. A cavity may be formed in the body 11 of the package and the light-emitting element 20 may be arranged on a bottom surface of the cavity.

The first lead frame 12 and the second lead frame 13 may be electrically disconnected and may supply current to the light-emitting element 20. The first lead frame 12 and the second lead frame 13 may reflect light generated from the light-emitting element 20 to increase optical efficiency and may externally discharge heat generated from the light-emitting element 20.

The light-emitting element 20 may be based on the aforementioned embodiment and may be electrically connected to the first lead frame 12 and the second lead frame 13 through a wire 14.

The light-emitting element 20 may be fixed to the bottom surface of the body 11 of the package using a conductive paste (not shown) or the like, the molding portion 16 may surround and protect the light-emitting element 20, and a fluorescent substance 17 is included in the molding portion 16 and is excited by light in a first wavelength band emitted from the light-emitting element 20 to emit light in a second wavelength band.

The light-emitting element package 10 may include one or a plurality of light-emitting elements according to the aforementioned embodiments installed therein and embodiments are not limited thereto.

The aforementioned light-emitting element and light-emitting element package may be used as a light source of an illumination system and, for example, may be used as a light-emitting device of an image display apparatus, an illumination apparatus, and so on.

When used as a backlight unit of an image display apparatus, the light-emitting element and the light-emitting element package may be used as an edge-type backlight unit or a direct-type backlight unit and, when used in an illumination device, the light-emitting element and the light-emitting element package may be a lamp device or a built-in type light source.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments.

INDUSTRIAL APPLICABILITY

A light-emitting element according to embodiments may be configured in such a way that a pit layer doped with Mg is formed to effectively block or reduce electrostatic discharge (ESD) and, simultaneously, to enhance luminous efficiency and optical power of the light-emitting element. Accordingly, the embodiments may be industrially applicable.

The invention claimed is:

1. A light-emitting device comprising:
a substrate;
a first conductive-type semiconductor layer disposed on the substrate and including at least one first recess;
a first electrode directly contacting an upper surface of the first conductive-type semiconductor layer;
a superlattice layer disposed on the first conductive-type semiconductor layer and including at least one second recess;
an active layer disposed on the superlattice layer and including at least one third recess;
an electron blocking layer disposed on the active layer and including at least one fourth recess; and
a second conductive-type semiconductor layer disposed on the electron blocking layer,
wherein the at least one first recess, the at least one second recess, the at least one third recess, and the at least one fourth recess are overlapped with each other,
wherein the at least one first recess includes a first depth,
wherein the at least one second recess includes a second depth,
wherein the at least one third recess includes a third depth,
wherein the at least one fourth recess includes a fourth depth,
wherein the first depth is less than the fourth depth,
wherein the second conductive-type semiconductor layer includes at least one protrusion protruding toward the substrate,
wherein a height of the protrusion is less than the fourth depth,
wherein a distance between a lowest portion of the at least one first recess in the first conductive-type semiconductor layer and an upper surface of the substrate is less than a distance between a lower surface of the first electrode and the upper surface of the substrate, and
wherein a distance between a topmost portion of the at least one first recess in the first conductive-type semiconductor layer and the upper surface of the substrate is substantially equal to a distance between the lower surface of the first electrode and the upper surface of the substrate.

2. The light emitting device of claim 1, wherein the second conductive-type semiconductor layer includes a first layer doped with Mg and a second layer that is the remaining region.

3. The light emitting device of claim 2, wherein the first layer and the second layer of the second conductive-type semiconductor layer are provided in a plural number and the plurality of first layers and the plurality of second layers are alternately stacked.

4. The light emitting device of claim 3, wherein the second conductive-type semiconductor layer includes four first layers and four second layers.

5. The light emitting device of claim 3, wherein the second conductive-type semiconductor layer is formed by performing an annealing process after the first layer and the second layer are stacked.

6. The light emitting device of claim 2, wherein the second conductive-type semiconductor layer includes a first region including at least one fifth recess formed therein and a second region that is the remaining region, and
wherein a first thickness measured as a thickness of the second region is 30 nm to 50 nm.

7. The light emitting device of claim 6, wherein a second thickness measured as the sum of thicknesses of the first layer and the second layer in the second region is 5 nm to 15 nm.

8. The light emitting device of claim 2, wherein the first layer includes MgN and the second layer includes GaN.

9. The light emitting device of claim 2, wherein the first layer is doped with Mg with a doping concentration of $1 \times 10^{18}$ to $5 \times 10^{18}$ atoms per $cm^3$.

10. The light emitting device of claim 1, wherein the first conductive-type semiconductor layer is doped with an n-type dopant and includes a third layer including the at least one first recess formed therein and a fourth layer disposed below the third layer.

11. The light emitting device of claim 10, wherein the second conductive-type semiconductor layer is doped with a p-type dopant and includes a fifth layer disposed on the second conductive-type semiconductor layer and a sixth layer disposed on the fifth layer.

12. The light emitting device of claim 1, wherein the protrusion in the second conductive-type semiconductor layer has a maximum width of 180 nm to 250 nm.

13. The light emitting device of claim 1, wherein a center of the at least one first recess, a center of the at least one second recess, a center of the at least one third recess, and a center of the at least one fourth recess are overlapped with each other.

14. The light emitting device of claim 1, wherein the first depth is equal to the second depth, and the third depth is equal to the fourth depth.

15. A light-emitting element comprising:
a substrate;
a first conductive-type semiconductor layer disposed on the substrate and including at least one first recess;
a first electrode directly contacting an upper surface of the first conductive-type semiconductor layer;
a superlattice layer disposed on the first conductive-type semiconductor layer and including at least one second recess;
an active layer disposed on the superlattice layer and including at least one third recess;
an electron blocking layer disposed on the active layer and including at least one fourth recess; and
a second conductive-type semiconductor layer disposed on the electron blocking layer,
wherein the second conductive-type semiconductor layer includes a first layer including MgN and a second layer including GaN;
wherein the first layer and the second layer of the second conductive-type semiconductor layer are provided in a plural number and the plurality of first layers and the plurality of second layers are alternately stacked, wherein the at least one first recess, the at least one second recess, the at least one third recess, and the at least one fourth recess are overlapped with each other, wherein the at least one first recess includes a first depth, wherein the at least one second recess includes a second depth, wherein the at least one third recess includes a third depth, wherein the at least one fourth recess includes a fourth depth, wherein the first depth is less than the fourth depth, wherein the second conductive-type semiconductor layer includes at least one protrusion protruding toward the substrate, wherein a height of the protrusion is less than the fourth depth, wherein a distance between a lowest portion of the at least one first recess in the first conductive-type semiconductor layer and an upper surface of the substrate is less than a distance between a lower surface of the first electrode and the upper surface of the substrate, and wherein a distance between a topmost portion of the at least one first recess in the first conductive-type semiconductor layer and the upper surface of the substrate is substantially equal to a distance between the lower surface of the first electrode and the upper surface of the substrate.

16. The light-emitting element of claim 15, wherein the first layer is doped with Mg with a doping concentration of $1\times10^{18}$ to $5\times10^{18}$ atoms per $cm^3$.

17. The light-emitting element of claim 15, wherein the second conductive-type semiconductor layer is formed by performing an annealing process after the first layer and the second layer are stacked.

18. The light-emitting element of claim 15, wherein a first thickness measured as a thickness of the second region is 30 nm to 50 nm.

19. The light-emitting element of claim 15, wherein a second thickness measured as the sum of thicknesses of the first layer and the second layer in the second region is 5 nm to 15 nm.

20. A light-emitting element package comprising:
a body including a cavity;
a lead frame installed on the body; and
a light-emitting element electrically connected to the lead frame,
wherein the light-emitting element comprises:
  a substrate;
  a first conductive-type semiconductor layer disposed on the substrate and including at least one first recess;
  a first electrode directly contacting an upper surface of the first conductive-type semiconductor layer;
  a superlattice layer disposed on the first conductive-type semiconductor layer and including at least one second recess;
  an active layer disposed on the superlattice layer and including at least one third recess;
  an electron blocking layer disposed on the active layer and including at least one fourth recess; and
  a second conductive-type semiconductor layer disposed on the electron blocking layer,
wherein the at least one first recess, the at least one second recess, the at least one third recess, and the at least one fourth recess are overlapped with each other, wherein the at least one first recess includes a first depth, wherein the at least one second recess includes a second depth, wherein the at least one third recess includes a third depth, wherein the at least one fourth recess includes a fourth depth, wherein the first depth is less than the fourth depth, wherein the second conductive-type semiconductor layer includes at least one protrusion protruding toward the substrate, wherein a height of the protrusion is less than the fourth depth, wherein a distance between a lowest portion of the at least one first recess in the first conductive-type semiconductor layer and an upper surface of the substrate is less than a distance between a lower surface of the first electrode and the upper surface of the substrate, and wherein a distance between a topmost portion of the at least one first recess in the first conductive-type semiconductor layer and the upper surface of the substrate is substantially equal to a distance between the lower surface of the first electrode and the upper surface of the substrate.

* * * * *